(12) United States Patent
Zhao et al.

(10) Patent No.: US 8,817,472 B2
(45) Date of Patent: Aug. 26, 2014

(54) METHODS AND SYSTEMS FOR ON-CHIP OSMOTIC AIRFLOW COOLING

(75) Inventors: Sam Ziqun Zhao, Irvine, CA (US); Milind S. Bhagavat, Fremont, CA (US)

(73) Assignee: Broadcom Corporation, Irvine, CA (US)

( * ) Notice: Subject to any disclaimer, the term of this patent is extended or adjusted under 35 U.S.C. 154(b) by 453 days.

(21) Appl. No.: 13/158,802

(22) Filed: Jun. 13, 2011

(65) Prior Publication Data

US 2012/0314367 A1 Dec. 13, 2012

(51) Int. Cl.
*H05K 7/20* (2006.01)
*H01L 23/34* (2006.01)
*F28F 7/00* (2006.01)

(52) U.S. Cl.
USPC .......... 361/694; 165/80.2; 257/713; 257/721; 174/15.1; 174/16.1

(58) Field of Classification Search
USPC ................ 361/679.46–679.54, 688–723; 165/80.2; 257/712–713, 721; 174/15.1, 174/16.1
See application file for complete search history.

(56) References Cited

U.S. PATENT DOCUMENTS

| | | | |
|---|---|---|---|
| 7,545,640 B2* | 6/2009 | Fisher et al. | 361/694 |
| 7,595,030 B2* | 9/2009 | Joannou | 422/186.04 |
| 2007/0002534 A1* | 1/2007 | Mongia et al. | 361/689 |
| 2009/0034204 A1* | 2/2009 | Wayman et al. | 361/709 |
| 2011/0116206 A1* | 5/2011 | Kim | 361/231 |
| 2011/0157813 A1* | 6/2011 | MacDonald et al. | 361/679.46 |
| 2011/0174468 A1* | 7/2011 | Lu et al. | 165/133 |
| 2012/0000627 A1* | 1/2012 | Jewell-Larsen et al. | 165/96 |
| 2012/0103196 A1* | 5/2012 | Humpston | 96/63 |
| 2012/0162903 A1* | 6/2012 | MacDonald et al. | 361/679.46 |

OTHER PUBLICATIONS

Horenstein, M.,N., "Applied Electrostatics," *Fundamentals of Engineering Electromagnetics*, Chapter 2, Balsal, R., ed., pp. 53-86, Taylor & Francis, Boston, MA (2006).

* cited by examiner

*Primary Examiner* — Zachary M Pape
(74) *Attorney, Agent, or Firm* — Sterne, Kessler, Goldstein & Fox P.L.L.C.

(57) ABSTRACT

An apparatus for cooling a semiconductor element is provided. The apparatus can include an electron emitter configured to emit electrons such that at least some of the emitted electrons become attached to air particulates and an air accelerator configured to generate an electric field that accelerates the air particulates toward the air accelerator to create an air flow over at least a portion of the semiconductor element. The air flow carries heat away from the at least a portion of the semiconductor element.

21 Claims, 17 Drawing Sheets

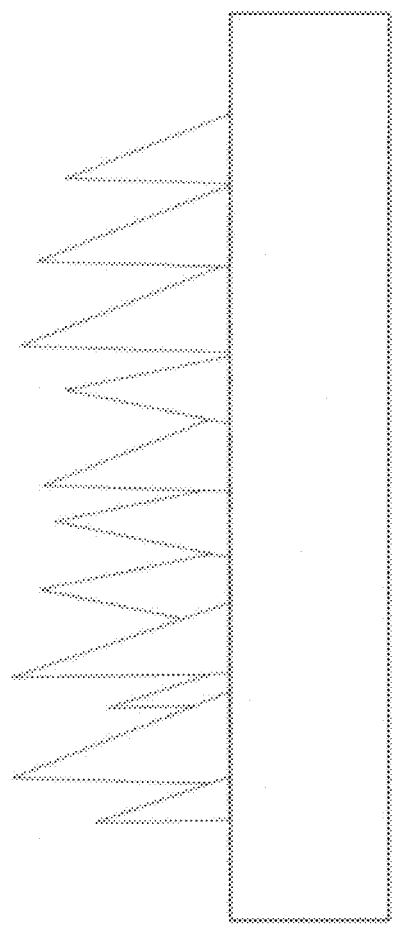
FIG. 11

METHODS AND SYSTEMS FOR ON-CHIP OSMOTIC AIRFLOW COOLING

BACKGROUND

1. Field

The present invention generally relates to cooling of integrated circuit devices.

2. Background Art

Integrated circuit (IC) devices typically include an IC die and a package that houses the IC die. During operation, the IC die can generate significant amounts of heat. This heat can cause damage to the IC die. To conduct heat away from the IC die, the packages often include heat spreading structures. For example, the package can include heat sinks and/or heat slugs attached to the IC die.

Heat sinks are often coupled to the top surface of the IC die and spread heat to the ambient environment. Heat slugs, on the other hand, are often coupled to the bottom surface of the IC die and conduct heat from the IC die to the printed circuit board (PCB).

Although the heat spreading structures conduct heat away from the IC die, they are often inefficient because they are coupled to all or substantially all of a surface of the IC die. Moreover, by cooling all or substantially all of a surface, a non-uniform temperature profile of the surface remains even after the cooling has been applied. A non-uniform temperature profile of a surface of the IC die can cause the surface to crack.

BRIEF SUMMARY

Embodiments described herein generally relate to apparatuses for cooling a semiconductor element and manufacturing the same. In one embodiment, an apparatus for cooling a semiconductor element includes an electron emitter configured to emit electrons such that at least some of the emitted electrons become attached to air particulates and an air accelerator configured to generate an electric field that accelerates the air particulates toward the air accelerator to create an air flow over at least a portion of the semiconductor element. The air flow carries heat away from the at least a portion of the semiconductor element.

In another embodiment, a method of manufacturing a semiconductor device includes forming an electron emitter configured to emit electrons such that at least some of the emitted electrons attach to air particulates, and forming an air accelerator configured to generate an electric field that accelerates the air particulates toward the air accelerator to an air flow over at least a portion of the semiconductor element. The air flow carries heat away from the at least a portion of the semiconductor element.

These and other advantages and features will become readily apparent in view of the following detailed description of the invention. Note that the Summary and Abstract sections may set forth one or more, but not all exemplary embodiments of the present invention as contemplated by the inventor(s).

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIGS. 11-15 show embodiments of electron emitters, according to embodiments of the present invention.

Figure 1:
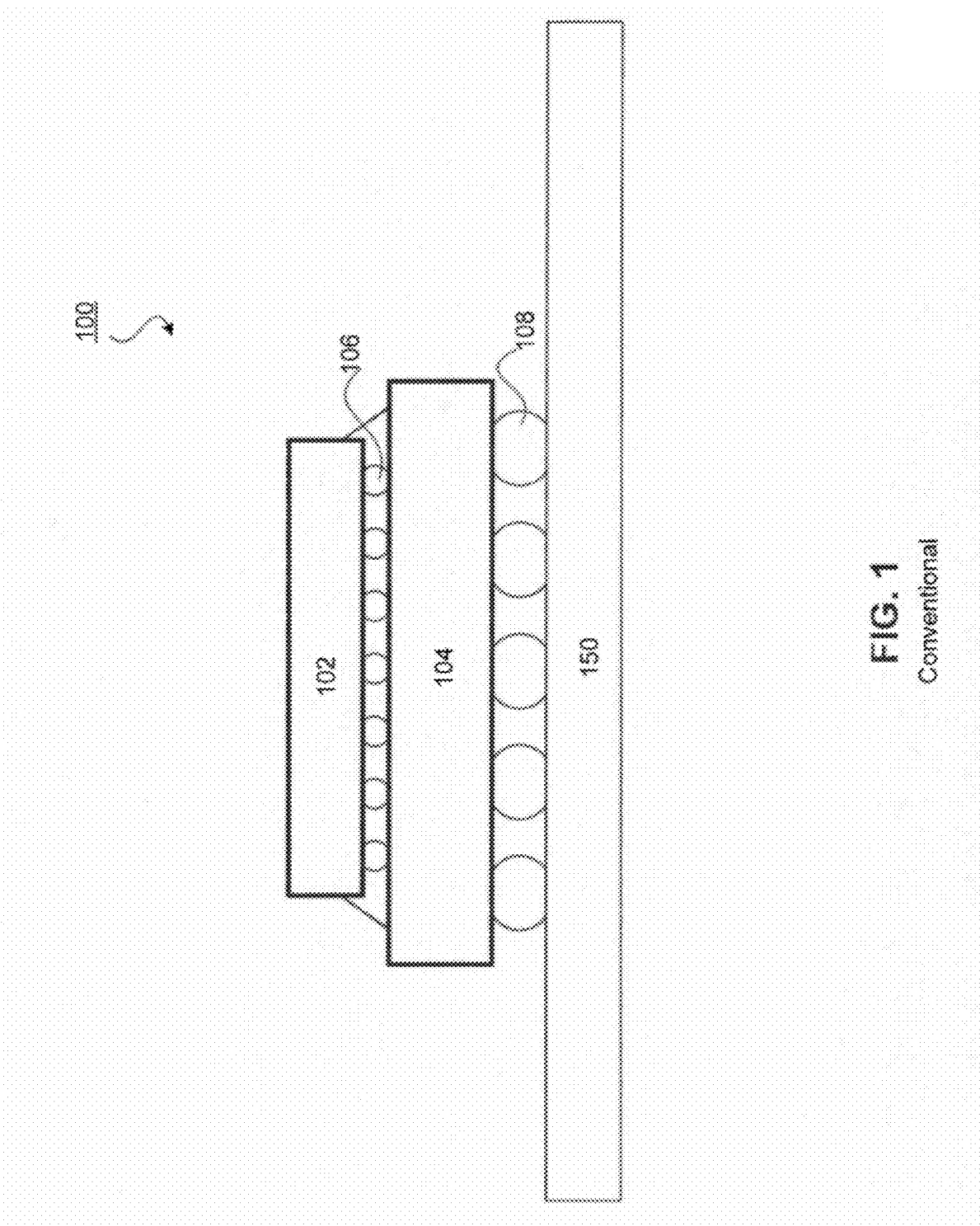
FIG. 1 shows a conventional ball grid array (BGA) package.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Furthermore, it should be understood that spatial descriptions (e.g., "above", "below", "left," "right," "up", "down", "top", "bottom", etc.) used herein are for purposes of illustration only, and that practical implementations of the structures described herein can be spatially arranged in any orientation or manner.

FIG. 1 shows a cross-sectional view of a conventional IC device 100. IC package 100 includes an IC die 102 and a substrate 104. IC die 102 is coupled to substrate 104 through solder bumps 106. IC device 100 also includes solder balls 108 that facilitate electrical interconnection between IC device 100 and a printed circuit board (PCB) 150.

Substrate 104 can be one of a variety of different types of substrates known those skilled in the relevant arts (e.g., organic or inorganic substrates). For example, substrate 104 can include FR-4.

During operation, portions of IC die 102 can generate substantial heat. This heat can cause IC die 102 to overheat because IC device 100 does not include a way to effectively conduct this heat away from IC die 102. For that reason, IC device 100 can also include a heat sink (not shown) coupled to IC die 102. The heat sink can be made out of a thermally conductive material and can be coupled to the top surface of IC die 102. The heat sink can conduct heat generated by IC die 102 to the ambient environment, thereby cooling IC die 102. Additionally or alternatively, IC device 100 can include a heat slug coupled to the bottom surface of IC die 102 and to PCB 150 (not shown). This heat slug can be formed out of a thermally conductive material and can be used to conduct heat from IC die 102 to PCB 150

Although heat sinks and heat slugs conduct heat from IC die 102, these elements can also have drawbacks. For example, heat slugs and heat sinks are typically coupled to all or substantially all of a surface of IC die 102. However, the thermal profile of the surfaces of IC die 102 may not be uniform. That is, during its operation, portions of a surface of IC die 102 may be warmer than other portions. Coupling a heat spreading structure, such as a heat sink or a heat slug, to all or substantially all of a surface of IC die 102 therefore often does not efficiently cool IC die 102 because cooling is provided indiscriminately. Along those same lines, those heat spreading structures do not increase the uniformity of the thermal profile of the surface of IC die 102. A non-uniform thermal profile of a surface of an IC die can lead to cracks forming on the surface of the IC die.

In embodiments described herein, on-chip cooling apparatuses are provided that provide targeted, localized cooling. The cooling apparatuses described herein generate a an airflow, or a "breeze," over portions of a semiconductor element. The air flow carries heat away from those portions of the semiconductor element. For example, the cooling structure can include an electron emitter and an air accelerator. The electron emitter can be configured to emit electrons, some of which become attached to air particulates (e.g., electron-seeking particulates such as dust, oxygen molecules, water vapor, or nitrogen molecules). Once electrons are attached to the particulates, the particulates become negatively charged. The air accelerator generates an electric field that attracts the charged air particulates, thereby accelerating the air particulates toward the air accelerator to generate an air flow that carries heat away from the surface of the semiconductor element.

Figure 2:
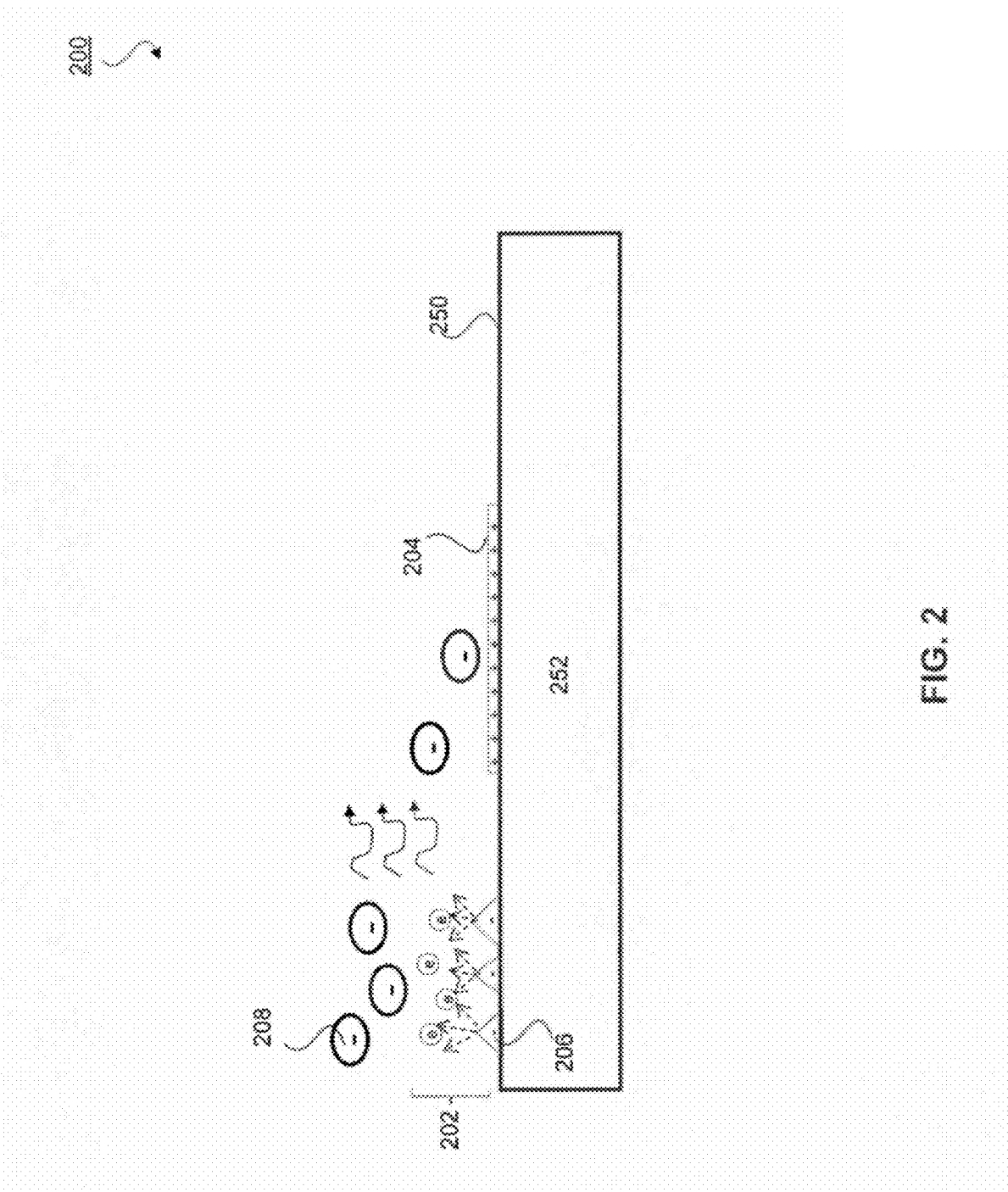
FIG. 2 shows a cross-sectional diagram of a cooling apparatus, according to an embodiment of the present invention.

FIG. 2 shows a cross-sectional diagram of a cooling apparatus 200, according to an embodiment of the present invention. Cooling apparatus 200 includes an electron emitter 202 and an air accelerator 204. Electron emitter 202 includes individual electron emitting elements 206.

As shown in FIG. 2, electron emitter 202 and air accelerator 204 are located on a surface 250 of device 252. Cooling apparatus 200 can be used to generate an air flow across a portion of surface 250 of semiconductor element 252 to carry heat away from that portion of surface 250. In an embodiment, semiconductor element 252 is an IC die similar to IC die 102.

In operation, electron emitting structures 206 emit electrons that attach themselves to electron-seeking air particulates 208. When emitted electrons attach themselves to air particulates 208, air particulates 208 become negatively charged. Thus, air particulates 208 are accelerated toward air accelerator 204 by the positive electric field created by air accelerator 204, thereby creating an airflow across a portion of surface 250 of semiconductor element 252. This breeze carries heat away from that portion of surface 250.

In an embodiment, each of electron emitting structures 206 can be negatively charged and air accelerator 204 can be positively charged. In one embodiment, air accelerator 204 can be a standard metal deposit. As shown in FIG. 2, each of electron emitting structures 206 has a sharp point. The electric field generated by each of structure can be most intense at the point of each structure, thereby increasing the efficiency with which each structure emits electrons.

Other systems can be used to generate charged air particulates. For example, a positively charged element can be used to pull electrons from air particulates, thereby polarizing the air particulates. Polarizing air particulates, however, requires relatively large voltages. In contrast, according to embodiments described herein, electron emission can be achieved with relatively low voltages, e.g., on the order of 10V. Lower voltages can be less costly to generate on surface 250 and less likely to damage semiconductor element 252.

Cooling apparatus 200 can be relatively small compared to the area of surface 250. Thus, instead of providing cooling for the entire surface 250 of semiconductor element 252, like the heat spreading structures described above, cooling apparatus 200 can be used to provide targeted, localized cooling at specific locations on surface 250. These locations can be locations that are known beforehand to likely be relatively warm during the operation of semiconductor element 252. For example, the circuits included in semiconductor element 252 can be modeled to determine locations on surface 250 that will be warmer than other locations on surface 250. In other words, cooling apparatus 200 can be used to efficiently cool semiconductor element 252 by providing localized cooling at hot spots on surface 250 of semiconductor element 252.

Figure 3:
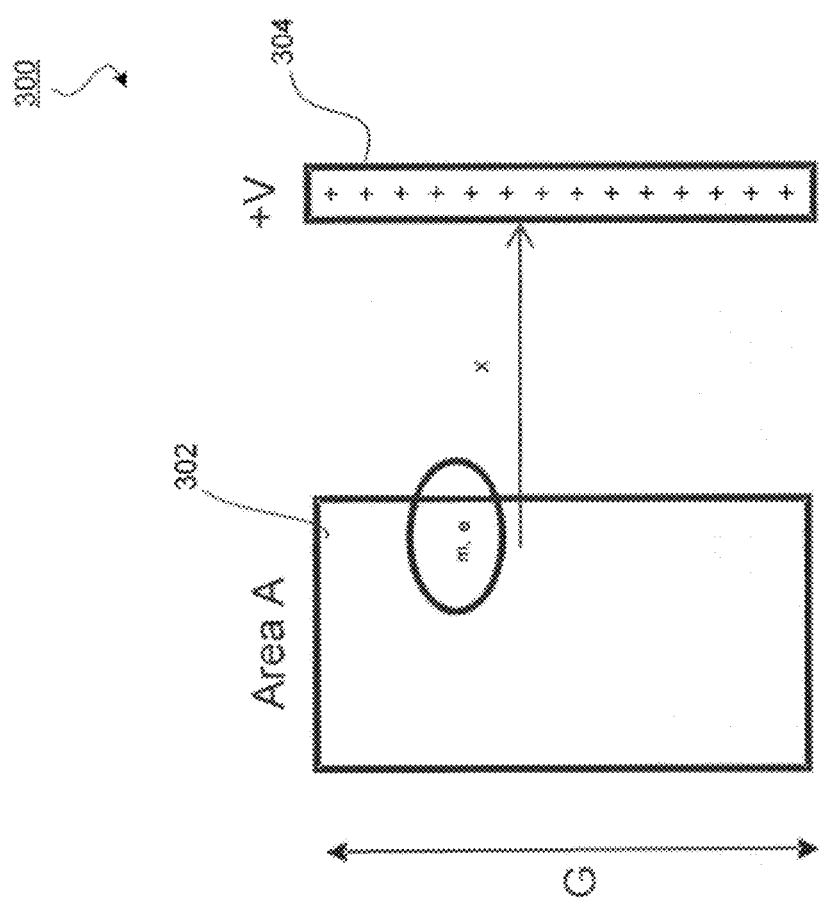
FIG. 3 shows a schematic diagram of a cooling apparatus, according to an embodiment of the present invention.

FIG. 3 shows a schematic diagram of a cooling apparatus 300, according to an embodiment of the present invention. Cooling apparatus 300 includes an electron emitter 302 and an air accelerator 304. As shown in FIG. 3, electron emitter 302 has a length G, and a projected two-dimensional area A. In the embodiment of FIG. 3, air accelerator 304 is a positively charged plate having a voltage of +V.

The number of particles to which electrons become attached, n, can be expressed as n=aiA, where i is electron ejection rate per unit area and a is the electron absorption fraction rate in air above the emitter.

The absolute value of the aggregate charge of the particulates after attachment can be expressed as q=ne, where e is the charge of an electron.

The total force, $F_T$, generated by cooling apparatus 300 can be expressed as $$F_T = \frac{VAiae}{\bar{x}} = M\ddot{x},$$

where $\bar{x}$ is the average mean free path of the charged particulates, M is the total mass of the air above electron emitter 302, and z is the acceleration of the charge particles to air accelerator 304.

The total mass of the air above the electron emitter 302 can also be expressed as $$M = \frac{M_o pAt_h}{RT},$$

where $M_o$ is the average molecular weight of air, p is the atmospheric pressure, $t_h$ is the thickness of air accelerator 304, R is the universal gas constant, and T is the ambient temperature (in Kelvin).

The volume flow rate of the pump created by cooling apparatus 300 can be expressed as $$Q = G \int \frac{ViaeRT}{M_o p\bar{x}} dt.$$

The above equation for the volume flow rate shows that the volume flow rate is directly proportional to the electron ejection rate per unit projected area, the absorption fraction rate of electrons by air particulates, and the temperature, and is inversely proportional to the atmospheric pressure. Because the electron ejection rate per unit area is directly proportional to the surface area of electron emitter 302, the volume flow rate is also directly proportional to the surface area of electron emitter 302.

Moreover, the equation for the volume flow rate also shows that the volume flow rate of the pump is independent of the projected two-dimensional area of electron emitter 302 and independent of the thickness of the airflow above electron emitter 302.

Figure 4:
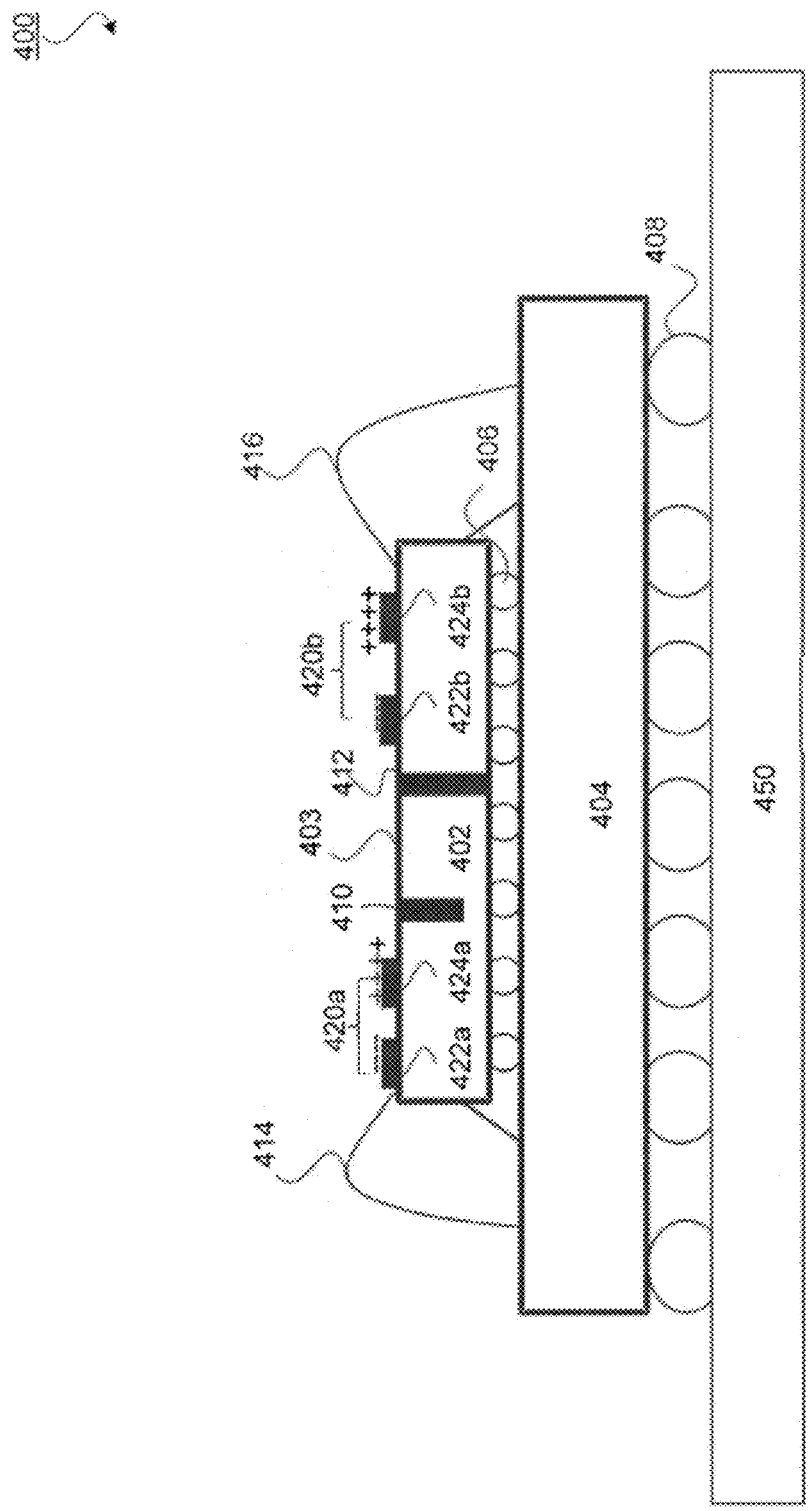
FIGS. 4-7 show cross-sectional diagrams of integrated circuit devices including cooling structures, according to embodiments of the present invention.

FIG. 4 shows a cross sectional diagram of an IC device 400 mounted onto a PCB 450, according to an embodiment of the present invention. IC device 400 includes an IC die 402, a substrate 404, solder bumps 406, solder balls 408, wire bonds 414 and 416, and cooling apparatuses 420a and 420b. IC die 402 can be formed out of similar materials as IC die 102 (e.g., silicon) and have similar functionality as IC die 102. Moreover, substrate 404, solder bumps 406, and solder balls 408, can be substantially similar to substrate 104, solder bumps 106, and solder balls 108, respectively.

Cooling apparatuses 420a and 420b, which are located on a surface 403 of IC die 402, include electron emitters 422a and 422b, respectively, and air accelerators 424a and 424b, respectively. Electron emitters 422a and 422b can be substantially similar to electron emitter 202 and air accelerators 424a and 424b can be substantially similar to air accelerator 204 (electron emitter 202 and air accelerator 204 are shown in FIG. 2). Each of cooling apparatuses 420a and 420b can be used to generate respective air flows that carry heat away from respective locations from of surface 403 of IC die 402. That is, each of cooling apparatuses 420a and 420b can be used to provide targeted, localized cooling at respective locations of surface 403. Moreover, cooling apparatuses 420a and 420b can be located at hot spots of surface 403, providing cooling to where it is needed most to efficiently cool surface 403 of IC die 402 and increasing the uniformity of the thermal profile of surface 403 of IC die 402.

In operation, electrons must be supplied to electron emitters 422a and 422b and a positive voltage mast be supplied to air accelerators 424a and 424b. In the embodiment shown in FIG. 4, these functions can be performed by wire bonds 414 and 416 and/or vias 410 and 412. For example, wire bonds 414 and 416 can be used to provide electrons to electron emitters 422a and 422b, while vias 410 and 412 can be used to provide positive voltage to air accelerators 424a and 424b. In other embodiments, electrons can be provided to electron emitters 422a and/or 422b using vias and voltages can be provided to air accelerators 424a and/or 424b using wirebonds.

Figure 5:
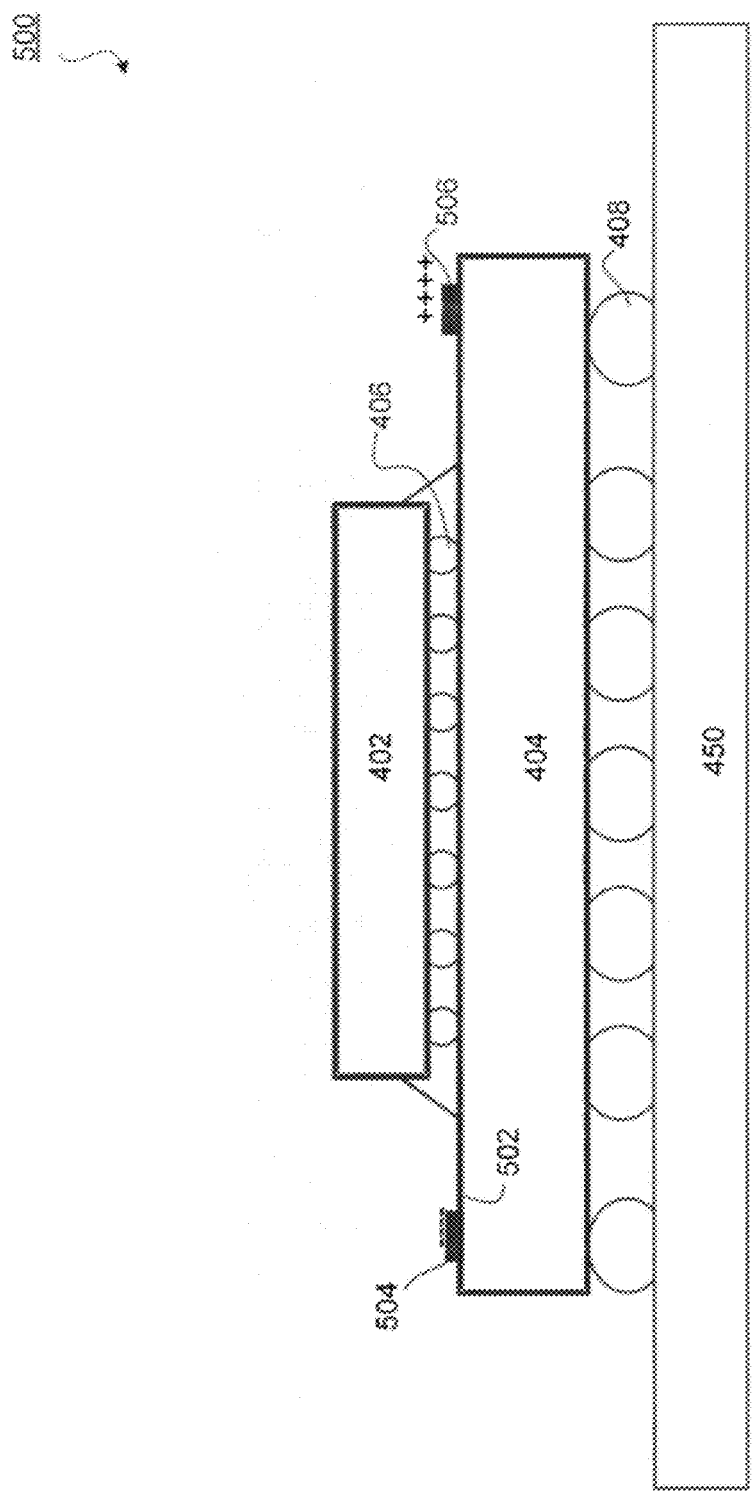

FIG. 5 shows a cross sectional diagram of an IC device 500, according to an embodiment of the present invention. IC device 500 is substantially similar to IC device 400 except that a cooling apparatus is located on a surface 502 of substrate 404. The cooling apparatus includes an electron emitter 504 and air accelerator 506, which are located on opposite sides of IC die 402. In operation, electron emitter 504 and air accelerator 506 can be used to generate an air flow across all of IC die 402. Metal traces on substrate 404 (not shown) can be used to provide electrons to electron emitter 504 and to provide a positive voltage to air accelerator 506.

Figure 6:
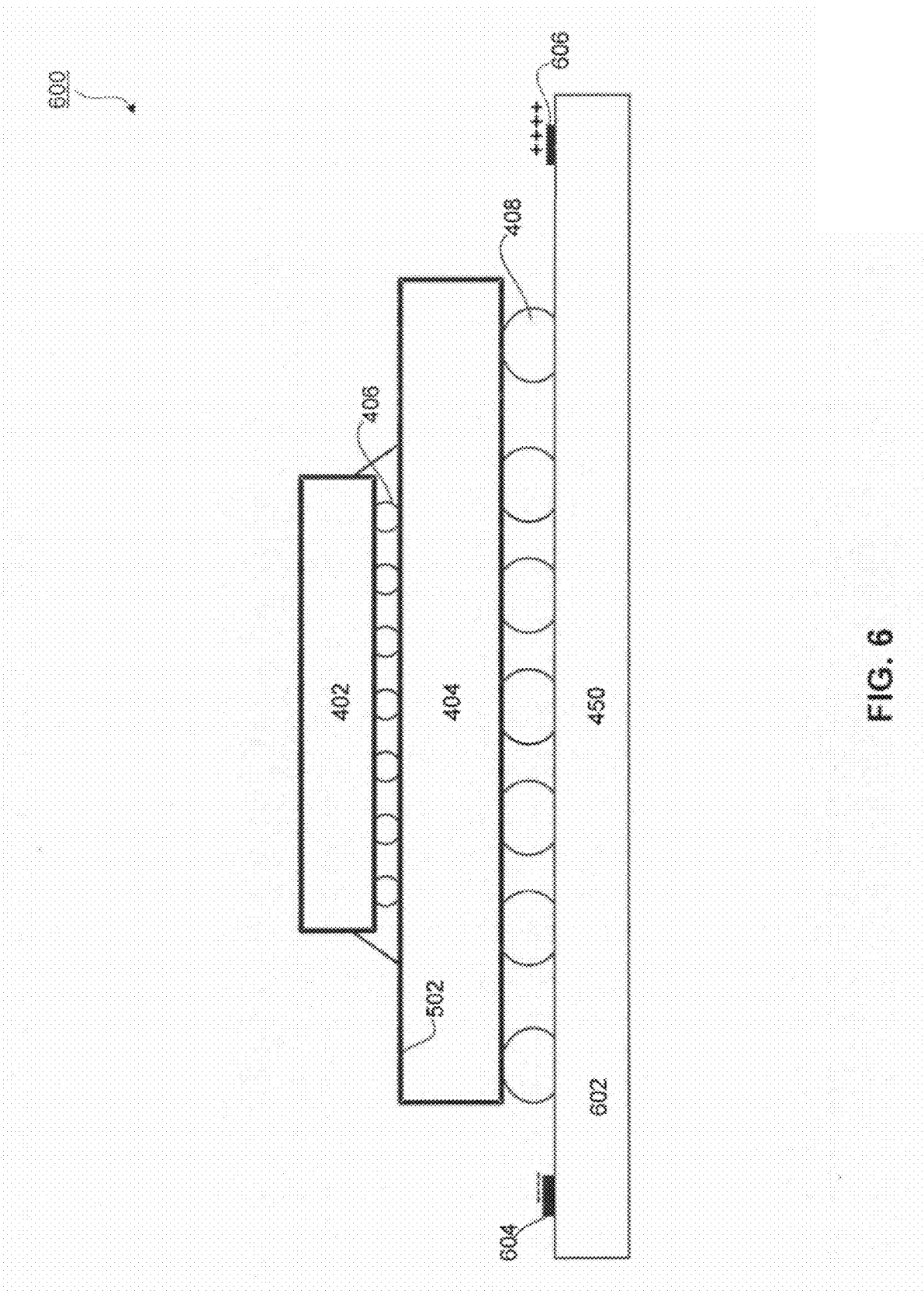

FIG. 6 shows a cross sectional diagram an IC device 600, according to an embodiment of the present invention. IC device 600 is substantially similar to IC device 500, except that a cooling apparatus is located or a surface 602 of PCB 450. The cooling apparatus includes an electron emitter 604 and an air accelerator 606, which are located on opposite sides of IC device 600. In the embodiment of FIG. 6, electron emitter 604 and air accelerator 606 can be used to generate an air flow across all of IC device 600.

As shown, FIGS. 4-6 illustrate embodiments on which the components of a cooling apparatus are located on different surfaces. In still other embodiments, the components of a cooling apparatus can be located on different surfaces. For example, an electron emitter can be located on a surface of a PCB while an air accelerator can be located on a surface of a substrate. In yet another embodiment, cooling apparatuses can be located on different surfaces. For example, one or more cooling apparatuses can be located on a surface of an IC die, a surface of a substrate, and/or a surface of a PCB for the same device.

Figure 7:
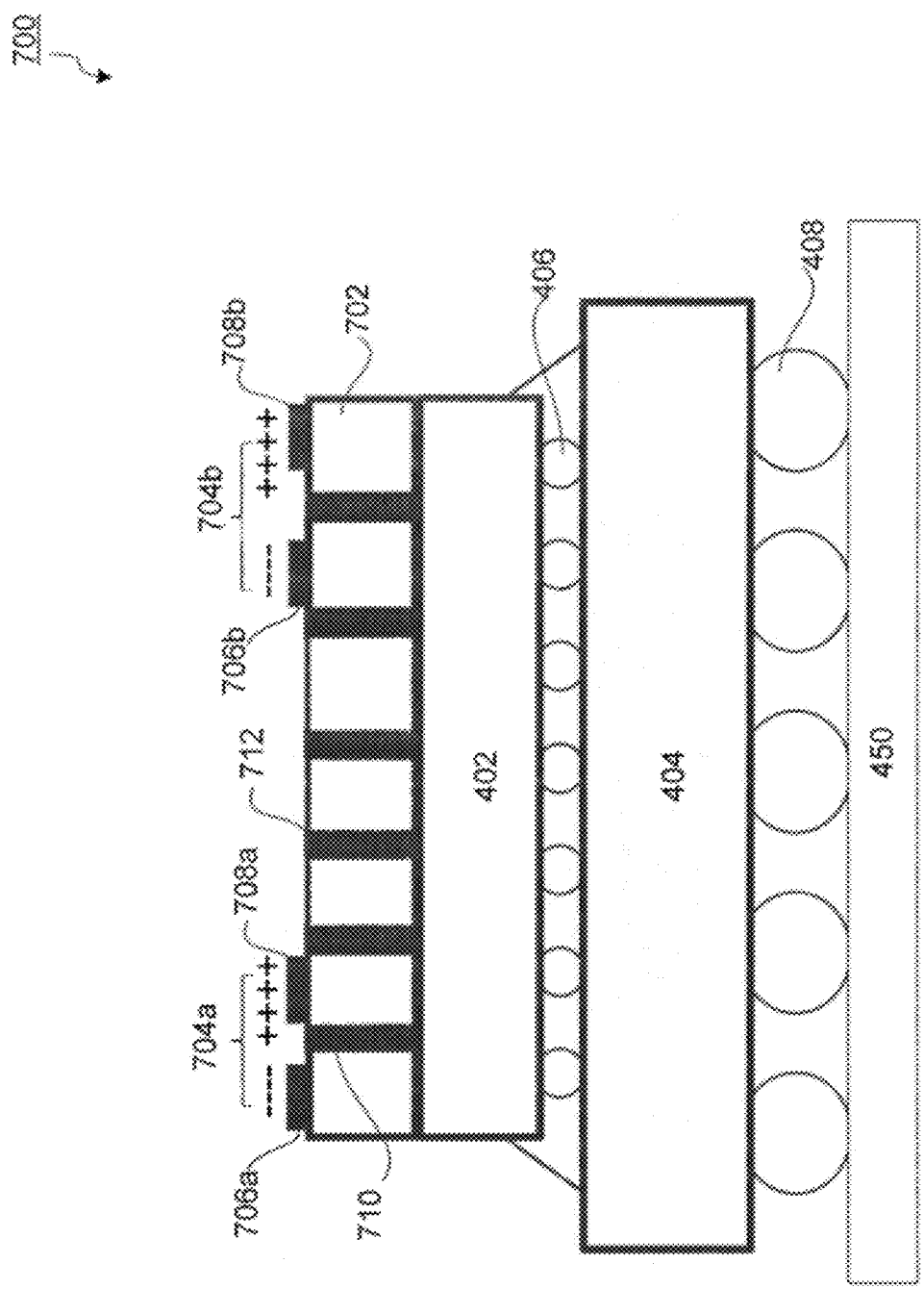

FIG. 7 shows a cross-sectional diagram of an IC device 700, according to an embodiment of the present invention. IC device 700 is substantially similar to IC device 400, except that for IC device 700 cooling is provided using an interposer 702. In an embodiment, interposer 702 is a spacing element that can be formed out of a variety of different materials. For example, interposer 702 can be similar to substrate 404 and can include FR-4 with one or more metal layers on and/or within it. In another embodiment, interposer 702 can include silicon (e.g., instead of FR-4). Interposer 702 includes cooling apparatuses 704a and 704b and optionally includes vias 710. Cooling apparatuses 704a and 704b include electron emitters 706a and 706b respectively, and, air accelerators 708a and 708b, respectively. In the embodiment of FIG. 7, interposer 702 is located on top of IC die 402 and the heat generated by IC die 402 can be conducted to a surface 712 of interposer 702. From surface 712 of interposer 702, the heat can be taken away from IC device 700 using the respective air flows generated by cooling apparatuses 704a and 704b.

In an embodiment, interposer 702 can be formed out of a thermally conductive material, such as silicon. In other embodiments, interposer 702 can be used out of materials similar to the materials that make up substrate 404, e.g., FR-4.

To enhance heat conduction from IC die 402 to surface 712 of interposer 702, interposer 702 can include thermal vias 710. Thermal vias 710 can be filled with thermally conductive material, such as copper or aluminum. In addition to conducting heat from IC die 402 to surface 712 of interposer 702, thermal vias 710 can also be used to provide electrons to electron emitters 706a and 706b and/or provide voltages to air accelerators 708a and 708b.

Figure 17:
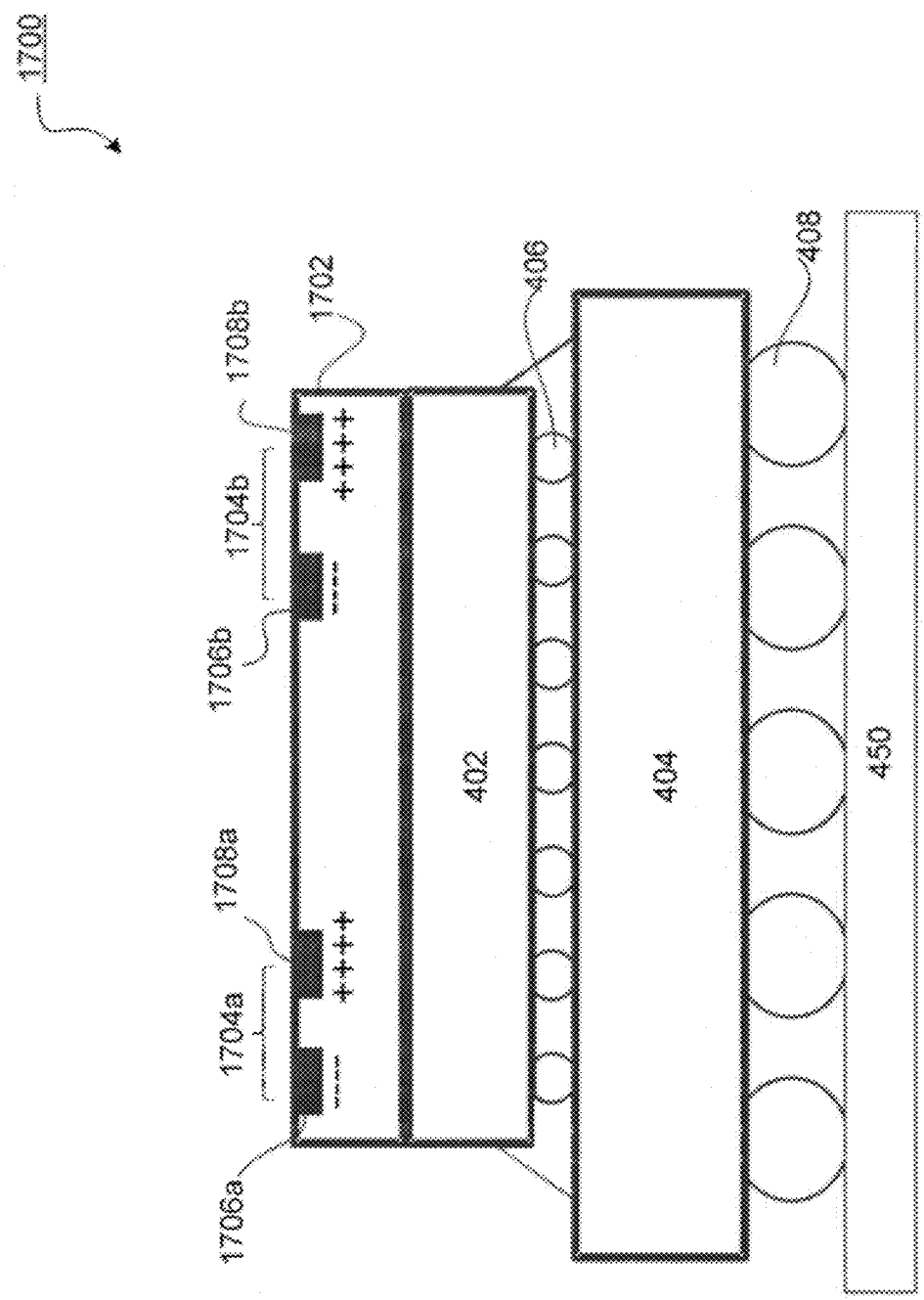
FIG. 17 shows a cross-sectional diagram of an IC device, according to an embodiment of the present invention.

FIG. 17 shows a cross-sectional diagram of an IC device 1700, according to an embodiment of the present invention. IC device 1700 is substantially similar to IC device 700 except that IC device 1700 includes a duct 1702 instead of interposer 702. Cooling apparatuses 1704a and 1704b are coupled to an inside surface of duct 1702. Cooling apparatuses 1704a and 1704b include electron emitters 1706a and 1706b, respectively, and air accelerators 1708a and 1708b, respectively. Electron emitters 1706a and 1706b can be substantially similar to electron emitters 706a and 706b, respectively, and air accelerators 1708a and 1708b can be substantially similar to air accelerators 708a and 708b, respectively.

Figure 18:
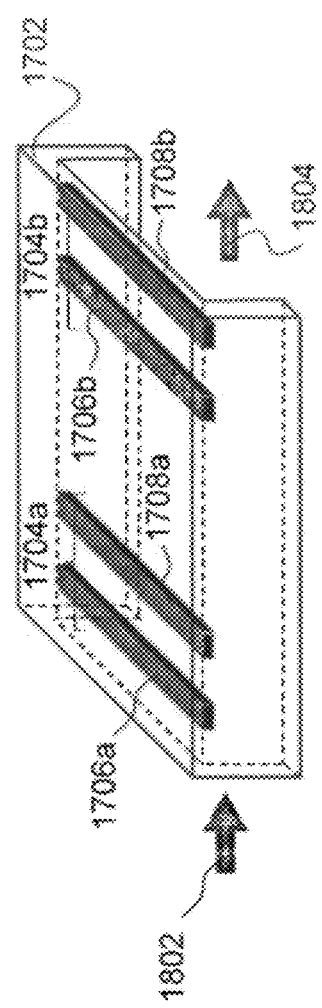
FIG. 18 shows an exemplary perspective view of a duct included in the IC device shown in FIG. 17, according to an embodiment of the present invention.

Duct 1702 can provide a path for air to travel over IC die 402, thereby cooling IC die 402. FIG. 18 shows a perspective view of duct 1702, according to an embodiment of the present invention. Arrows 1802 and 1804 illustrate the path that air travels through duct 1702. As would be appreciated by those skilled in the relevant art based on the description herein, the closer the air flow caused by the cooling apparatuses 1704a and 1704b is to the top surface of IC die 402, the greater the cooling effect of the air flow. Thus, by controlling the dimensions of duct 1702, the air flow caused by cooling apparatuses 1704a and 1704b can be brought closer to IC die 402, thereby increasing the cooling effects of the air flow. Moreover, duct 1702, along with cooling apparatuses 1704a and 1704b, can form a modular cooling element that can be configured to provide cooling independent of the structure and design of a specific IC die, thereby reducing manufacturing costs as the same element can be used for a variety of different IC dies. Furthermore, this modular cooling element can be manufactured independently of IC die 402. As would be appreciated by those skilled in the relevant art based on the description herein, the manufacturing the cooling element independent of IC die 402 increases the total manufacturing yield.

Duct 1702 can be formed out of a variety of materials known to those skilled in the relevant arts. For example, duct 1702 can be formed out of a metal such as copper or aluminum. In such an embodiment, electron emitters 1706a and 1706b and air accelerators 1708a and 1708b can be located on a dielectric pad coupled to duct 1702 (not shown in FIGS. 17 and 18), thereby electrically isolating electron emitters 1706a and 1706b and air accelerators 1708a and 1708b from duct 1702. In another embodiment, duct 1702 can be formed out of materials similar to those used to faun substrate 404 (e.g., FR-4) or silicon.

In an embodiment, voltage can be supplied to electron emitters 1706a and 1706b and air accelerators 1708a and 1708b using jumper cables. Alternatively, traces can be used to route voltages to electron emitters 1706a and 1706b and air accelerators 1708a and 1708b from substrate 404 (e.g., in the embodiment in which duct 1702 is formed out of a material similar to the material used to form substrate 404).

Figure 8:
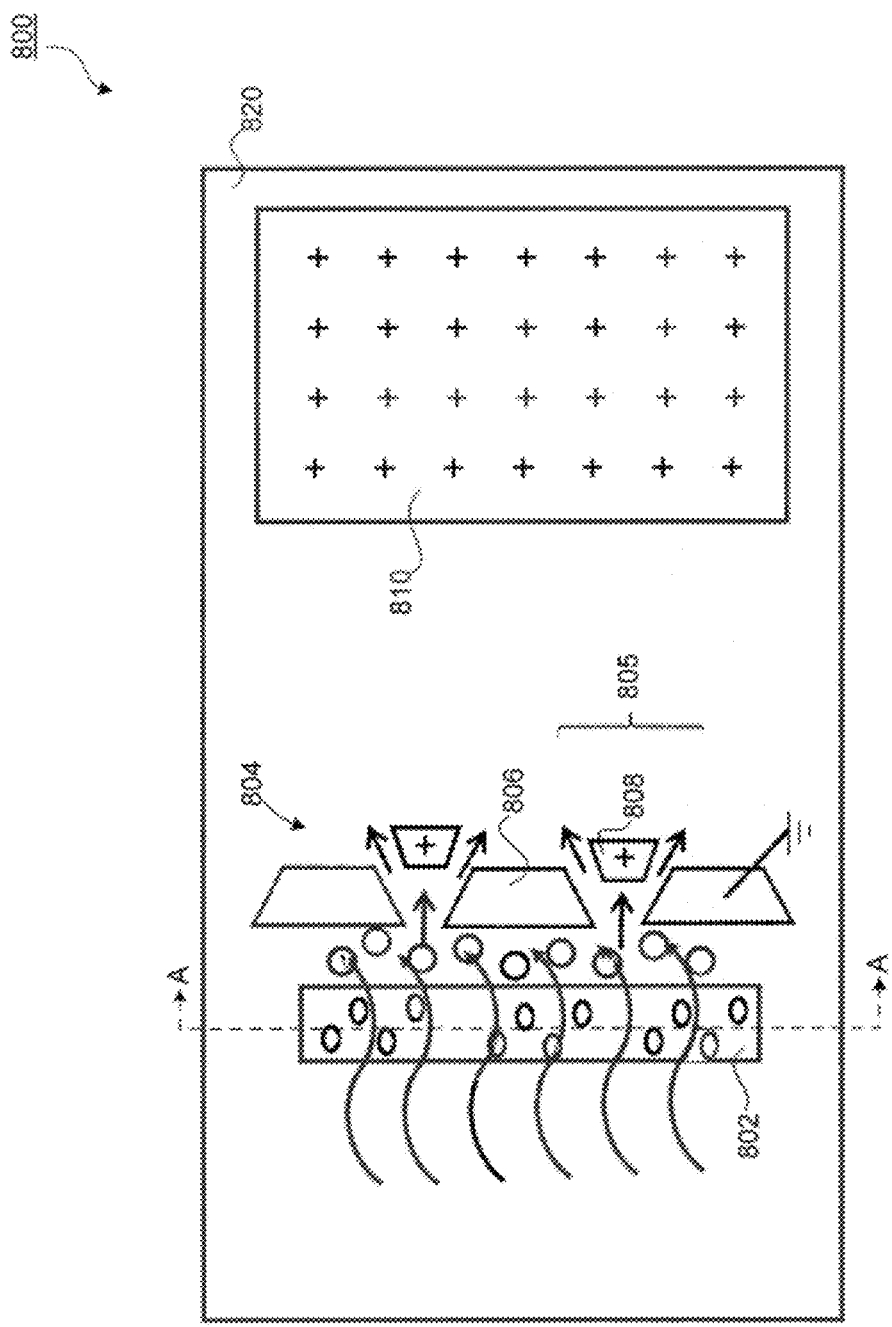
FIGS. 8-9 show top views of cooling apparatuses, according to embodiments of the present invention.

FIG. 8 shows a top view of a cooling apparatus 800 formed on a semiconductor element 820, according to an embodiment of the present invention. For example, cooling apparatus 800 can be formed on a surface of an IC die, such as on surface 403 of IC die 402, described with respect to FIG. 4. Cooling apparatus 800 includes an electron emitter 802, an air accelerator 804, and a discharger 810. Air accelerator 804 includes grounded blocks 806 and positively electrodes 808.

As described above, cooling apparatuses according to embodiments described herein generate an airflow by emitting electrons which become attached to air particulates and accelerating the air particulates using an electric field generated by an air accelerator. In the embodiment of FIG. 8, after electrons from electron emitter 802 become attached to air particulates, the air particulates are accelerated by electric fields created by electrodes 808 of air accelerator 804. Air accelerator 804 also optionally includes grounded, trapezoid-shaped blocks 806. Trapezoid blocks 806 together form a diffuser that increases the directionality of the airflow toward the electrodes 808 and also increases the rate at which the airflow travels to electrodes 808. As shown in FIG. 8, adjacent ones of blocks 806 create nozzles 805 through which the airflow passes, which increases the directionality and speed of the air flow. The diffuser is an optional element thus, in alternate embodiments, the diffuser may be omitted.

The cooling apparatus 800 also optionally includes discharger 810. As would be appreciated by those skilled in the relevant arts based on the description herein, charged air particulates can harm the surrounding environment. To prevent that harm, discharger 810 operates to neutralize the charged air particulates. As shown in FIG. 8, discharger 810 is a positively charged plate. When air particulates pass by electrodes 808, they are attracted to discharger 810. Once they make contact with discharger 810, the air particulates are neutralized, thereby avoiding the harm that charged particulates can cause. In an embodiment, the voltage of discharger 810 can be less than the voltage of electrodes 808 to ensure that the air flow properly passes through diffuser 804.

Cooling apparatus 800 can be used in any of the above-mentioned embodiments. For example, cooling apparatus 800 can be located on surface 403 of IC die 402, described with respect to FIG. 4. As described above, cooling apparatuses can be located at hot spots of an IC die. Thus, multiple cooling apparatuses 800 can be located at respective locations on IC die 402. In another embodiment, electron emitter 802 and air accelerator 804 can be reproduced at different hot spots of IC die 402, but IC die 402 may only include one discharger 810. In such an embodiment, discharger 810 can be relatively large compared to electron emitter 802 and air accelerator 804 so that it can discharge the charged air particulates generated by each cooling apparatus 800.

Figure 9:
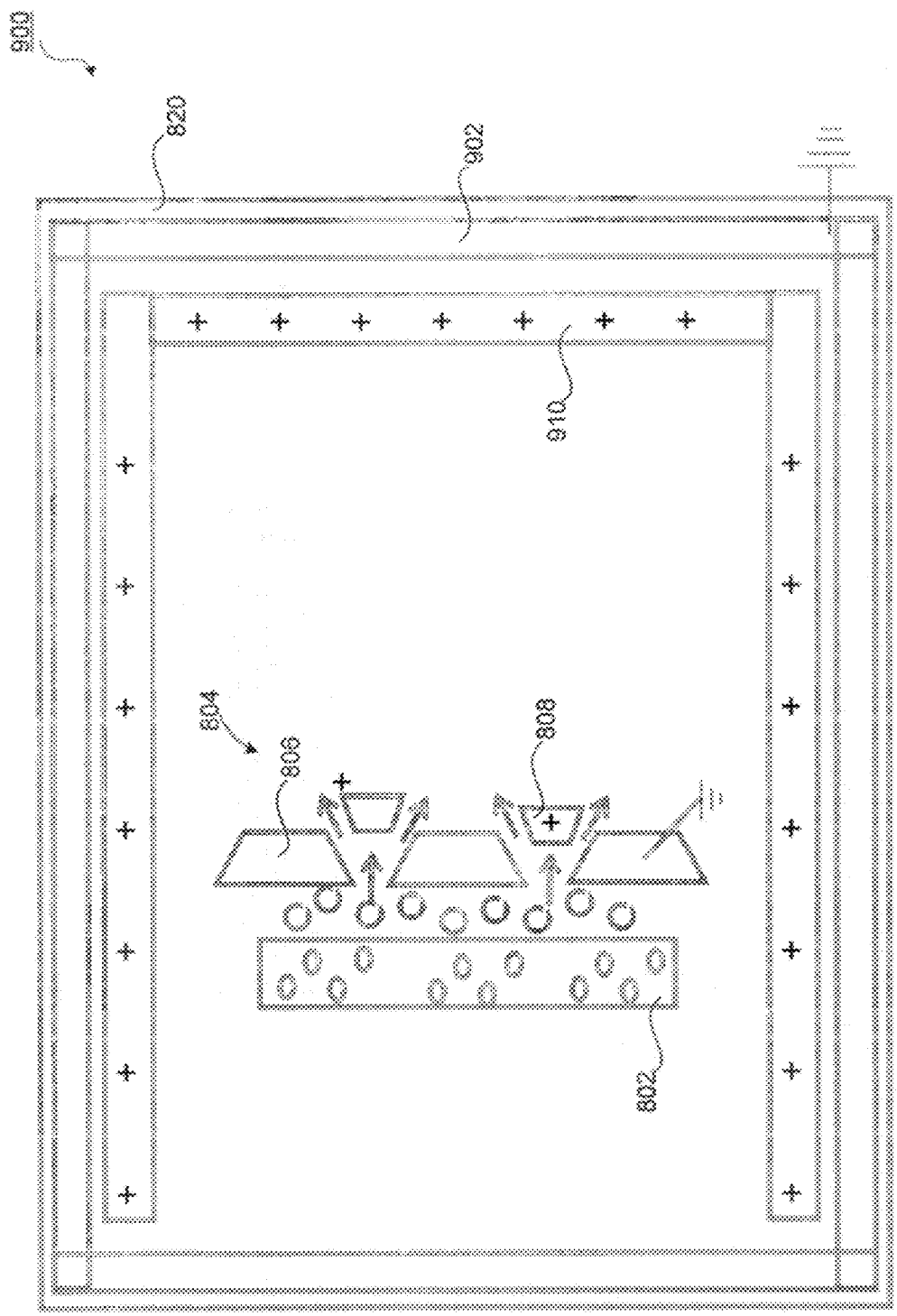

FIG. 9 shows a top view of a cooling apparatus 900, according to an embodiment of the present invention. Cooling apparatus 900 is substantially similar to cooling apparatus 800 except that discharger 810 is replaced with discharger 910 and cooling apparatus 900 additionally includes a grounded fence 902. As shown in FIG. 9, discharger 910 is a positively charged metal plate that surrounds electron emitter 802 and air accelerator 804. In doing so, discharger 910 can better be suited to discharge air particulates generated by electron emitter 802. That is, because charged air particulates can travel unpredictably after passing electrodes 808, using a discharger that surrounds electron emitter 802 and air accelerator 804 may more effectively neutralize those air particulates.

Moreover, grounded fence 902 can be used to physically trap any particulates that are not discharged by discharger 910. In the embodiment in which semiconductor element 820 is an IC die, discharger 910 and grounded fence 902 can be located on peripheral regions of the IC die. Similarly, in the embodiment in which semiconductor element 820 is a substrate or a PCB, discharger 910 and grounded fence 902 can be located along the periphery of the substrate or the PCB, respectively.

Figure 10:
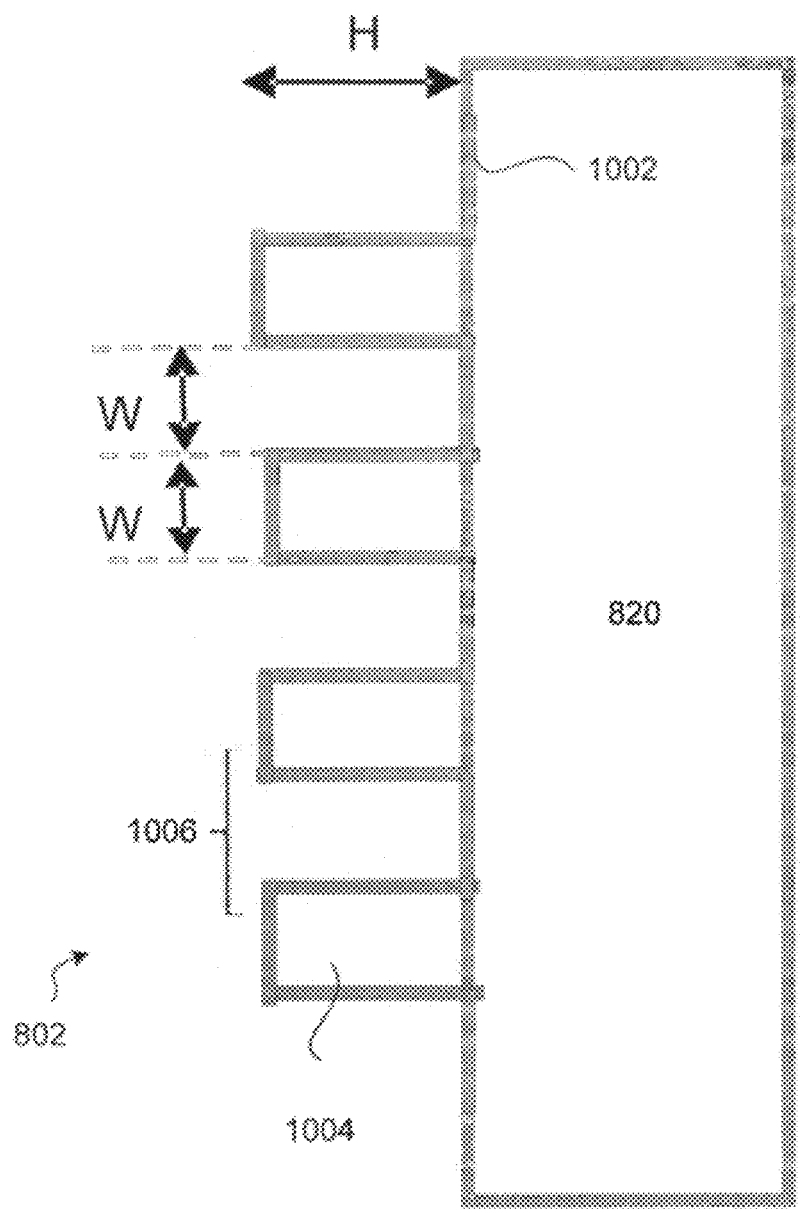
FIG. 10 shows a cross-sectional view of a semiconductor element, according to an embodiment of the present invention.

FIG. 10 shows a cross sectional diagram along line A-A of semiconductor element 820 shown in FIG. 8. As described above, the electron ejection rate increases with the surface area of the electron emitter. To increase the volume flow rates of the airflow, then, the surface area of electron emitter can be increased. As shown in FIG. 10, surface 1002 of semiconductor element 820 includes ridges 1004 and valleys 1006. Electron emitter 802 is formed on surface 1002 of semiconductor element 820. Thus, by including ridges 1004 and valleys 1006 on surface 1002 of semiconductor element 820, the surface area of electron emitter 802 increases. In other words, the emitter surface area is increased by the cumulative surface area of ridges 1004 and valleys 1006.

Specifically, the surface area of electron emitter 802 increases by a factor of (1+R), where R is the aspect ratio of surface 1002. In FIG. 10, the height of ridges 1004 is labeled as H and the spacing between adjacent ridges 1004 is labeled as W. Thus, in the embodiment of FIG. 10, aspect ratio R is equal to H/W. Therefore the increase in surface area for electron emitter 802 in the embodiment of FIG. 10 is $$\left(1 + \frac{H}{W}\right).$$

Aspect ratios can also be increased through other meats. For example, deep reactive ion etching can be used to obtain an aspect ratio of five.

In an embodiment, structures having sharp points can be used for electron emitters, such as electron emitters 206, 422a, 422b, 504, 604, 706a, 706b, and 802. A sharp-pointed structures can enhance the ability of the structure to emit electrons at a given voltage because the electric field for a given voltage is intensified at the peak of the structure.

For example, FIG. 11 shows an electron emitter 1100, according to an embodiment of the present invention. Electron emitter 1100 is a nano-scale field emission structure having a series of sharp points. For example, electron emitter 1100 can be textured platinum created using CMOS compatible sputter deposition. Other similar structures can also be used such as electroformed aluminum-gold couples, die electric films that allow for cold electron emission, and fluoropolymers, which eject electrons when subjected to AC voltage.

Figure 12:
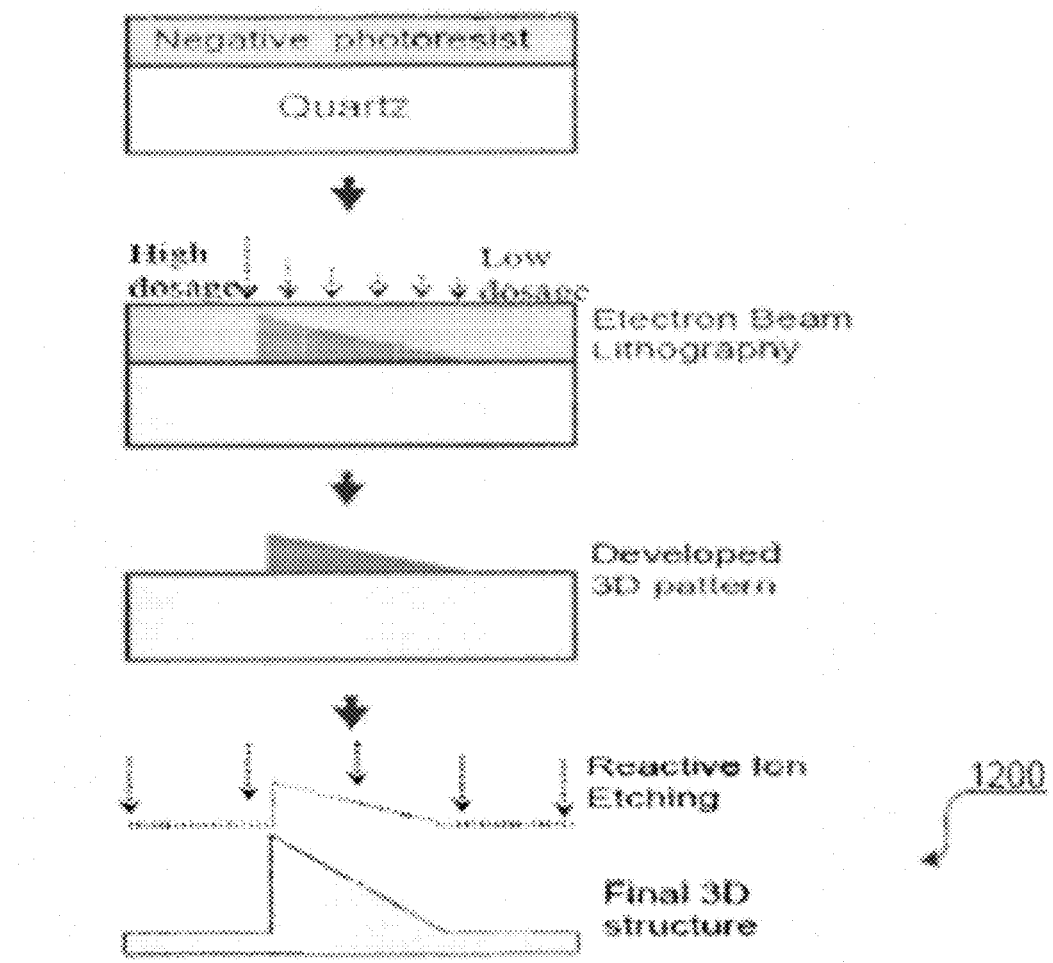

FIG. 12 shows the formation of a lithographically developed sharp point structure 1200, according to an embodiment of the present invention. As shown in FIG. 12, the starting material for this structure can include negative photoresist deposited on top of quartz. The negative photoresist is exposed to varying dosages of electron beam lithography to develop a 3D pointed structure. Reactive ion etching can also be used to create electron emitter 1200. In a further embodiment, an electron emitter includes multiple structures similar to electron emitter 1200.

Figure 13:
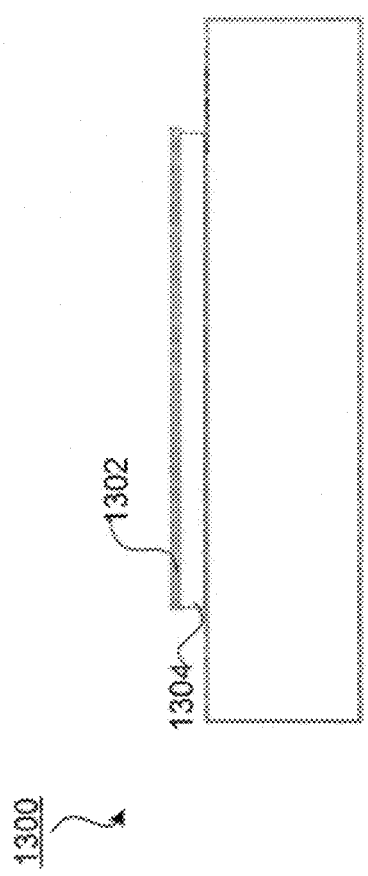

FIG. 13 shows an electron emitter 1300, according to an embodiment of the present invention. Electron emitter 1300 includes a rare earth oxide 1302 and a metal cathode 1304. According to the Wehnelt effect, when a negatively charged metal surface is coated with certain metal oxides, the metal cathode emits a considerably greater number of electrons at lower temperatures and lower applied voltages, compared to the situation where it is not coated with the metal oxide. In the embodiment of FIG. 13, metal cathode 1304 is coated with a rare earth oxide 1302. For example, rare earth oxide 1302 can include oxides of calcium, strontium, and barium. Thus, in the embodiment of FIG. 13, metal cathode 1304 can be used to emit electrons that become attached to air particulates.

Figure 14:
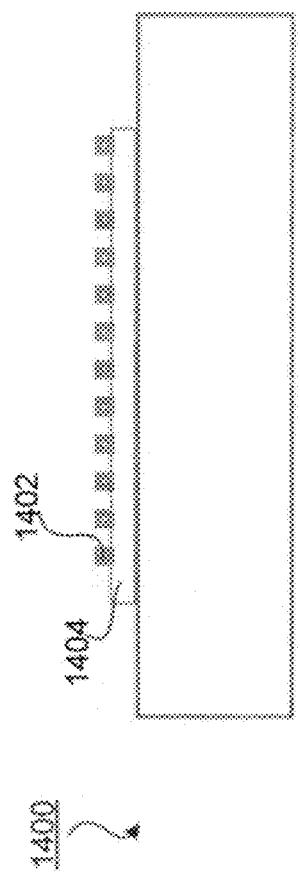

FIG. 14 shows a diagram of an electron emitter 1400, according to an embodiment of the present invention. Electron emitter 1400 includes current carrying wires 1402 and an insulator 1404. Current carrying wires 1402 can be formed out of elements that, when heated, emit electrons (e.g., Tungsten). In a further embodiment, the cross sectional area of wires 1402 can be made to be relatively small so that wires 1402 heat up more for a given current.

Figure 15:
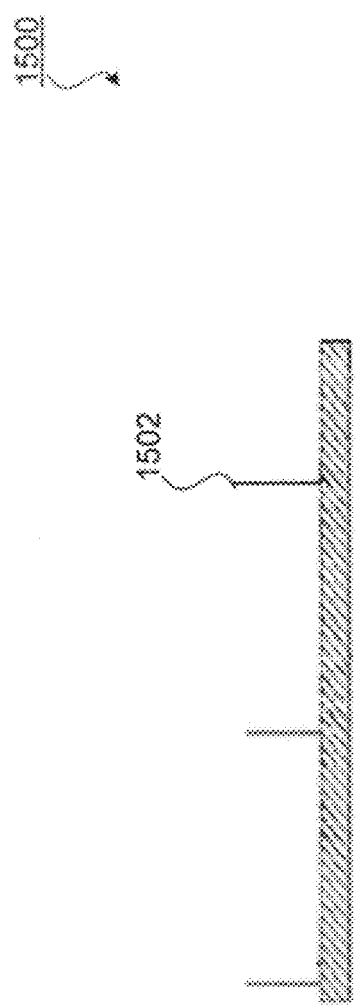

FIG. 15 shows a diagram of an electron emitter 1500, according to an embodiment of the present invention. Electron emitter 1500 includes carbon nano tubes 1502. Carbon nano tubes 1502 provide sharp points for field emission electrons when they are subject to an electric potential. Carbon nano tubes 1502 can be created using a sole-gel process on a semiconductor element.

Many of the above mentioned electron emitters can be formed using standard manufacturing processes. For example, the field emission structures shown in FIG. 11, the pointed structure shown in FIG. 12, the rare earth oxide and metal cathode shown in FIG. 13, and the current carrying wires in FIG. 14, can be formed using standard manufacturing processes.

Figure 16:
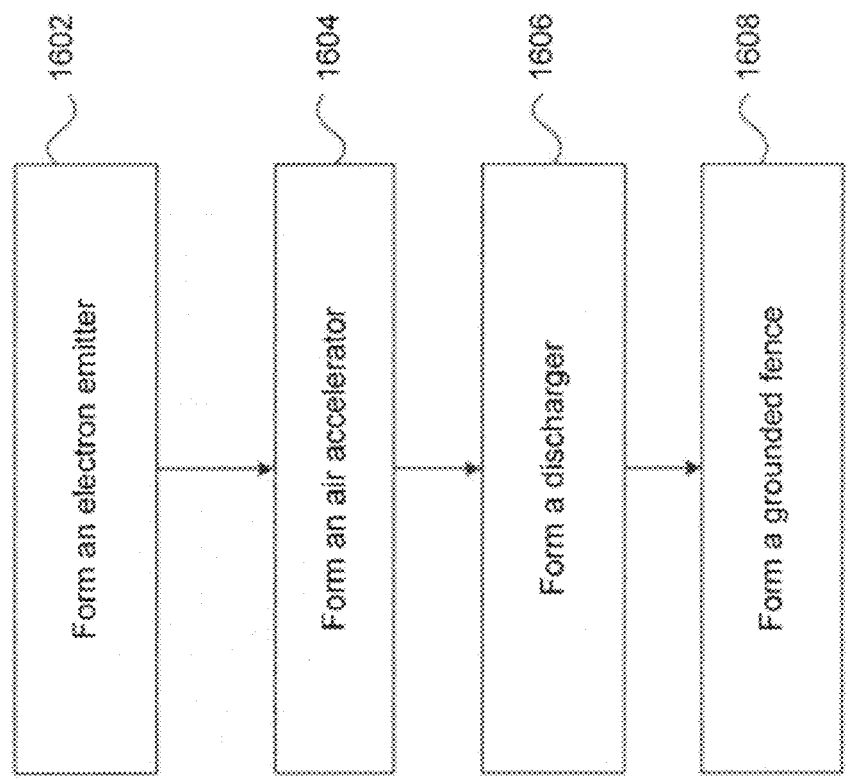
FIG. 16 shows a flowchart providing example steps for manufacturing an IC device, according to an embodiment of the present invention.

FIG. 16 shows a flowchart 1600 providing example steps for manufacturing an IC device, according to an embodiment of the present invention. Other structural and operational embodiments will be apparent to persons skilled in the relevant art(s) based on the following discussion. The steps shown in FIG. 16 do not necessarily have to occur in the order shown. The steps of FIG. 16 are described in detail below.

In step 1602, an electron emitter is formed. For example, an electron emitter can be formed according to any of the processes described above with respect to FIGS. 11-15.

In step 1604, an air accelerator is formed. For example, an air accelerator such as air accelerator 804 shown in FIGS. 8 and 9 can be formed using standard manufacturing processes. Thus, forming an air accelerator can include forming electrodes and grounded blocks, as shown in FIGS. 8 and 9.

In step 1606, a discharger is formed. For example, a discharger, such as discharger 810 shown in FIG. 8 or discharger 910 shown in FIG. 9, can be formed using standard manufacturing processes.

In step 1608, a grounded fence is formed. For example, a grounded fence, such as grounded fence 902 shown in FIG. 9, can be formed.

In an embodiment, steps 1602-1068 can be performed during standard manufacturing processes. For example, steps 1602-1608 can be formed during a standard manufacturing process for an IC die.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, hut should be defined only in accordance with the following claims and their equivalents.

What is claimed is:

1. An apparatus for cooling a semiconductor element, comprising:
    an electron emitter configured to emit electrons such that at least some of the emitted electrons become attached to air particulates; and
    an air accelerator configured to generate an electric field that accelerates the air particulates toward the air accelerator to create an air flow that carries heat away from at least a portion of the semiconductor element,
    wherein at least one of the electron emitter and the air accelerator is coupled to a surface of an interposer, the interposer being coupled to a surface of the semiconductor element and wherein the surface of the interposer is coupled to the surface of the semiconductor element through a via, the via passing through the interposer.

2. The apparatus of claim 1, wherein the electron emitter comprises a structure having a sharp point.

3. The apparatus of claim 1, wherein the electron emitter is formed on a surface and wherein the surface comprises a plurality of ridges and a plurality of trenches.

4. The apparatus of claim 1, wherein the electron emitter comprises at least one of a field emission structure, a point structure, a rare earth oxide, a wire, or a nano-tube.

5. The apparatus of claim 1, wherein the air accelerator comprises a positively charged electrode.

6. The apparatus of claim 1, wherein the air accelerator comprises a diffuser configured to increase a directionality of the air flow.

7. The apparatus of claim 6, wherein the diffuser is further configured to create a nozzle through which the air flow passes.

8. The apparatus of claim 1, further comprising:
a discharger configured to neutralize the air particulates.

9. The apparatus of claim 8, wherein the discharger comprises a positively charged plate and wherein the positively charged plate at least partially surrounds the electron emitter.

10. The apparatus of claim 9, wherein the discharger further comprises a grounded fence that surrounds the electron emitter.

11. The apparatus of claim 1, wherein the
via is coupled to the electron emitter, the via being configured to provide electrons to the electron emitter.

12. A method of manufacturing a semiconductor device, comprising:
forming an electron emitter on a surface of an interposer, the electron emitter being configured to emit electrons such that at least some of the emitted electrons attach to air particulates; and
forming an air accelerator on the surface of the interposer, the air accelerator being configured to generate an electric field that accelerates the air particulates toward the air accelerator to create an air flow over at least a portion of the interposer, wherein the air flow carries heat away from at least a portion of the semiconductor device,
wherein the interposer is coupled to a surface of the semiconductor device and wherein the surface of the interposer is coupled to the surface of the semiconductor device through a via, the via passing through the interposer.

13. The method of claim 12, wherein forming the electron emitter comprises:
plating the surface of the interposer with a field emission structure.

14. An integrated circuit (IC) device, comprising:
a substrate having opposing first and second surfaces;
an IC die having opposing first and second surfaces, the first surface of the IC die coupled to the first surface of the substrate;
an electron emitter formed on the second surface of the IC die and configured to emit electrons received from the substrate such that at least some of the emitted electrons become attached to air particulates; and
an air accelerator configured to generate an electric field that accelerates the air particulates toward the air accelerator to create an air flow that carries heat away from at least a portion of the IC die.

15. The IC device of claim 14, wherein the second surface of the IC die comprises a plurality of ridges and a plurality of trenches.

16. The IC device of claim 14, further comprising:
a wirebond coupled to the electron emitter and the substrate, and configured to provide the electrons to the electron emitter.

17. The IC device of claim 14, further comprising:
a via that passes through the IC die and is configured to provide the electrons to the electron emitter.

18. The IC device of claim 16, further comprising:
a plurality of bumps coupled to the first surface of the substrate and the first surface of the IC die.

19. The IC device of claim 14, wherein the air accelerator is formed on the second surface of the IC die.

20. The IC device of claim 14, further comprising:
a plurality of solder balls coupled to the second surface of the substrate.

21. The IC device of claim 14, wherein the electron emitter is a first electron emitter, the IC device further comprising: a second electron emitter formed on the second surface of the IC die.

* * * * *